(12) United States Patent  
Nishida (10) Patent No.: US 8,803,618 B2
(45) Date of Patent: *Aug. 12, 2014

(54) OPTICAL MODULE FOR ATOMIC OSCILLATOR AND ATOMIC OSCILLATOR

(75) Inventor: Tetsuo Nishida, Suwa (JP)

(73) Assignee: Seiko Epson Corporation (JP)

( * ) Notice: Subject to any disclaimer, the term of this patent is extended or adjusted under 35 U.S.C. 154(b) by 6 days.

This patent is subject to a terminal disclaimer.

(21) Appl. No.: 13/359,754

(22) Filed: Jan. 27, 2012

(65) Prior Publication Data

US 2012/0235752 A1   Sep. 20, 2012

(30) Foreign Application Priority Data

Mar. 14, 2011   (JP) ................................. 2011-055433

(51) Int. Cl.
H03B 15/00   (2006.01)

(52) U.S. Cl.
USPC ............................................ 331/94.1; 331/3

(58) Field of Classification Search
USPC .............. 331/94.1, 3; 372/26, 31, 32, 98, 106
See application file for complete search history.

(56) References Cited

U.S. PATENT DOCUMENTS

| | | | |
|---|---|---|---|
| 3,546,622 A | 12/1970 | Yariv et al. | |
| 3,720,882 A | 3/1973 | Tang et al. | |
| 4,733,397 A | 3/1988 | Gallagher et al. | |
| 6,201,821 B1 | 3/2001 | Zhu et al. | |
| 6,363,091 B1 | 3/2002 | Zhu et al. | |
| 6,570,459 B1 | 5/2003 | Nathanson et al. | |
| 6,806,784 B2 | 10/2004 | Hollberg et al. | |
| 6,900,702 B2 | 5/2005 | Youngner et al. | |
| 6,993,058 B2* | 1/2006 | Zhu ................................ | 372/106 |
| 7,098,744 B2 | 8/2006 | Hayes | |
| 7,378,913 B2 | 5/2008 | Laiacano et al. | |
| 8,237,514 B2 | 8/2012 | Aoyama et al. | |
| 8,314,661 B2 | 11/2012 | Chindo | |
| 2002/0163394 A1 | 11/2002 | Hollberg et al. | |
| 2005/0073690 A1* | 4/2005 | Abbink et al. ................. | 356/451 |
| 2007/0258673 A1* | 11/2007 | El-Sherif ......................... | 385/10 |

(Continued)

FOREIGN PATENT DOCUMENTS

| | | |
|---|---|---|
| EP | 1 473 605 A2 | 11/2004 |
| JP | 2007-336136 | 12/2007 |

(Continued)

OTHER PUBLICATIONS

Extended European Search Report for Application No. EP 11 17 3564 dated Nov. 15, 2011 (5 pages).

Primary Examiner — Robert Pascal
Assistant Examiner — Jeffrey Shin
(74) Attorney, Agent, or Firm — Harness, Dickey & Pierce, P.L.C.

(57) ABSTRACT

An optical module for an atomic oscillator using a quantum interference effect includes a light source adapted to emit light including a fundamental wave having a predetermined wavelength, and sideband waves of the fundamental wave, a wavelength selection section receiving the light from the light source, and adapted to transmit the sideband waves out of the light input, a gas cell encapsulating an alkali metal gas, and irradiated with light transmitted through the wavelength selection section, and a light detection section adapted to detect an intensity of light transmitted through the gas cell, and the wavelength selection section includes a fiber Bragg grating, and a voltage application section adapted to apply a voltage to the fiber Bragg grating.

9 Claims, 5 Drawing Sheets

(56) References Cited

U.S. PATENT DOCUMENTS

| | | | |
|---|---|---|---|
| 2009/0175621 A1* | 7/2009 | Kobayashi et al. | 398/77 |
| 2011/0274127 A1* | 11/2011 | Masuda et al. | 372/25 |
| 2012/0235752 A1 | 9/2012 | Nishida | |
| 2012/0235753 A1 | 9/2012 | Nishida | |
| 2012/0242417 A1* | 9/2012 | Nishida | 331/94.1 |

FOREIGN PATENT DOCUMENTS

| | | |
|---|---|---|
| JP | 2009-089116 | 4/2009 |
| JP | 2009-164331 | 7/2009 |
| JP | 2009-188598 | 8/2009 |

* cited by examiner

OPTICAL MODULE FOR ATOMIC OSCILLATOR AND ATOMIC OSCILLATOR

BACKGROUND

1. Technical Field

The present invention relates to an optical module for an atomic oscillator and an atomic oscillator.

2. Related Art

In recent years, an atomic oscillator using coherent population trapping (CPT) as a quantum interference effects has been proposed, and downsizing of the device and reduction in power consumption have been expected. Anatomic oscillator using CPT is an oscillator using a phenomenon (an electromagnetically induced transparency (EIT) phenomenon) that exists if an alkali metal atom is irradiated with two resonance lights with respective wavelengths (frequencies) that are different from each other at the same time. As a result, absorption of the two resonance lights stops. For example, in JP-A-2009-89116, there is described an atomic oscillator as an atomic oscillator using CPT, which is configured to include an optical module having a light source for emitting a coherent light, a gas cell for encapsulating alkali metal atoms, and a light receiving element for detecting the intensity of the light transmitted through the gas cell.

In the atomic oscillator using CPT, a semiconductor laser is used, for example, as the light source. In the atomic oscillator using the semiconductor laser as the light source, for example, the drive current of the semiconductor laser is modulated to thereby cause a sideband wave in the light emitted from the semiconductor laser, and thus the EIT phenomenon is developed.

However, the light emitted from the semiconductor laser the drive current of which is modulated includes not only the sideband wave but also a fundamental wave (a carrier wave) having a center wavelength making no contribution to the EIT phenomenon. If the alkali metal atoms are irradiated with the fundamental wave, there is a case in which the wavelength (the frequency) of the light absorbed by the alkali metal atoms varies (the AC Stark effect) to thereby degrade the stability of the frequency of the atomic oscillator.

SUMMARY

An advantage realized by some aspects of the invention is to provide an optical module for an atomic oscillator, which is capable of providing an atomic oscillator with high frequency stability. Further, another advantage realized by some aspects of the invention is to provide an atomic oscillator having the optical module for an atomic oscillator, described above.

An aspect of the invention is directed to an optical module for an atomic oscillator using a quantum interference effect including a light source adapted to emit light including a fundamental wave having a predetermined wavelength, and sideband waves of the fundamental wave, a wavelength selection section receiving the light from the light source, and adapted to transmit the sideband waves out of the light input, a gas cell encapsulating an alkali metal gas, and irradiated with light transmitted through the wavelength selection section, and a light detection section adapted to detect an intensity of light transmitted through the gas cell, wherein the wavelength selection section includes a fiber Bragg grating, and a voltage application section adapted to apply a voltage to the fiber Bragg grating.

According to such an optical module for an atomic oscillator, the wavelength selection section can decrease the intensity of the fundamental wave included in the light from the light source or eliminate the fundamental wave. Thus, it is possible to control or prevent the alkali metal atom from being irradiated with the fundamental wave making no contribution to the EIT phenomenon. Therefore, it is possible to reduce frequency variation due to the AC Stark effect to thereby provide an oscillator with high frequency stability. Further, since the wavelength selection section has the voltage application section for applying a voltage to the fiber Bragg grating, the wavelength selection characteristics (the wavelength range of the light to be selected by the fiber Bragg grating) of the fiber Bragg grating can be varied using the electro-optic effect. Thus, the wavelength selection section can correct the shift in the wavelength selection characteristics of the fiber Bragg grating due to manufacturing error, environmental variation, and so on.

The optical module for an atomic oscillator of the above aspect of the invention may be configured such that the voltage application section has a first electrode and a second electrode, and the fiber Bragg grating is disposed between the first electrode and the second electrode.

According to such an optical module for an atomic oscillator, the wavelength selection section can be made to have a simple configuration.

The optical module for an atomic oscillator of the above aspect of the invention may be configured such that the light source is a surface emitting laser.

According to such an optical module for an atomic oscillator, since the surface emitting laser requires a small current for generating the gain compared to the edge emitting laser, reduction in power consumption can be achieved.

The optical module for an atomic oscillator of the above aspect of the invention may be configured to further include an optical element adapted to make the light emitted from the light source enter the fiber Bragg grating.

According to such an optical module for an atomic oscillator, it is possible to efficiently guide the light emitted from the light source to the fiber Bragg grating.

Another aspect of the invention is directed to an atomic oscillator including the optical module for an atomic oscillator described above.

Since such an atomic oscillator includes the optical module for an atomic oscillator according the aspect of the invention described above, it is possible to reduce the frequency variation due to the AC Stark effect to thereby enhance the frequency stability.

Still another aspect of the invention is directed to an atomic oscillator using a quantum interference effect including a light source adapted to emit light including a fundamental wave having a predetermined wavelength, and sideband waves of the fundamental wave, a wavelength selection section receiving the light from the light source, and adapted to transmit the sideband waves out of the light input, a gas cell encapsulating an alkali metal gas, and irradiated with light transmitted through the wavelength selection section, and a light detection section adapted to detect an intensity of light transmitted through the gas cell, wherein the wavelength selection section includes a fiber Bragg grating, and a voltage application section adapted to apply a voltage to the fiber Bragg grating.

According to such an atomic oscillator, the wavelength selection section can decrease the intensity of the fundamental wave included in the light from the light source or eliminate the fundamental wave. Thus, it is possible to control or prevent the alkali metal atom from being irradiated with the fundamental wave making no contribution to the EIT phenomenon. Therefore, it is possible to reduce frequency variation due to the AC Stark effect to thereby provide an oscillator with high frequency stability. Further, since the wavelength selection section has the voltage application section for applying a voltage to the fiber Bragg grating, the wavelength selection characteristics (the wavelength range of the light to be selected by the fiber Bragg grating) of the fiber Bragg grating can be varied using the electro-optic effect. Thus, the wavelength selection section can correct the shift in the wavelength selection characteristics of the fiber Bragg grating due to manufacturing error, environmental variation, and so on.

BRIEF DESCRIPTION OF THE DRAWINGS

The invention will be described with reference to the accompanying drawings, wherein like numbers reference like elements.

DESCRIPTION OF AN EXEMPLARY EMBODIMENT

An exemplary embodiment of the invention will hereinafter be described with reference to the accompanying drawings.

Figure 1:
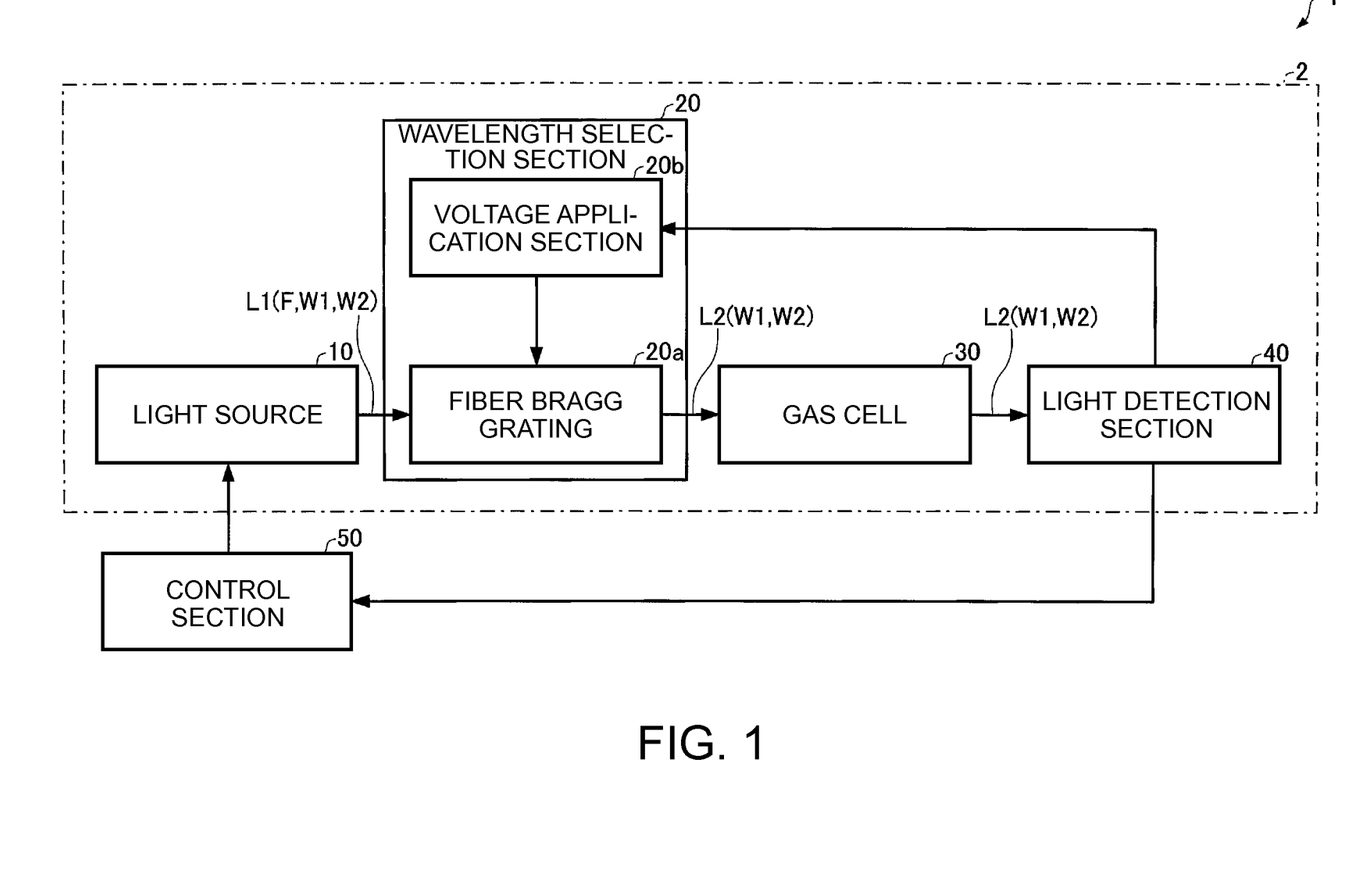
FIG. 1 is a functional block diagram of an atomic oscillator according to an embodiment of the invention.

Firstly, an optical module and an atomic oscillator according to the embodiment will be explained with reference to the accompanying drawings. The atomic oscillator according to the present embodiment includes an optical module according to the present embodiment. FIG. 1 is a functional block diagram of the atomic oscillator 1 according to the present embodiment. The atomic oscillator 1 is an oscillator using a quantum interference effect.

The atomic oscillator 1 includes an optical module 2 and a control section 50.

The optical module 2 includes a light source 10, a wavelength selection section 20, a gas cell 30, and a light detection section 40.

The light source 10 generates a first light L1 including a fundamental wave F having a predetermined center wavelength (center frequency), and first and second sideband waves W1, W2 having respective wavelengths different from each other.

The wavelength selection section 20 selects the first and second sideband waves W1, W2 from the first light L1, and then emits it as a second light L2. The wavelength selection section 20 has a fiber Bragg grating (hereinafter also referred to an "FBG") 20a for selectively emitting light in a predetermined wavelength range, and a voltage application section 20b for applying a voltage to the FBG 20a. The voltage application section 20b can vary the wavelength range for the selection (wavelength selection characteristics) of the FBG 20a by applying a voltage to the FBG 20a.

The gas cell 30 encapsulates an alkali metal gas, and is irradiated with the second light L2.

The light detection section 40 detects the intensity of the second light L2 transmitted through the gas cell 30.

The control section 50 performs control so that the difference in wavelength (frequency) between the first sideband wave W1 and the second sideband wave W2 becomes equal to the frequency corresponding to the difference in energy between the two ground levels of the alkali metal atoms encapsulated in the gas cell 30 based on the detection result of the light detection section 40. The control section 50 generates a detection signal having a modulation frequency $f_m$ based on the detection result of the light detection section 40. Then, the light source 10 modulates the fundamental wave F having a predetermined frequency $f_0$ based on the detection signal to thereby generate the first sideband wave W1 having a frequency $f_1 = f_0 + f_m$, and the second sideband wave W2 having a frequency $f_2 = f_0 - f_m$.

Figure 2A:
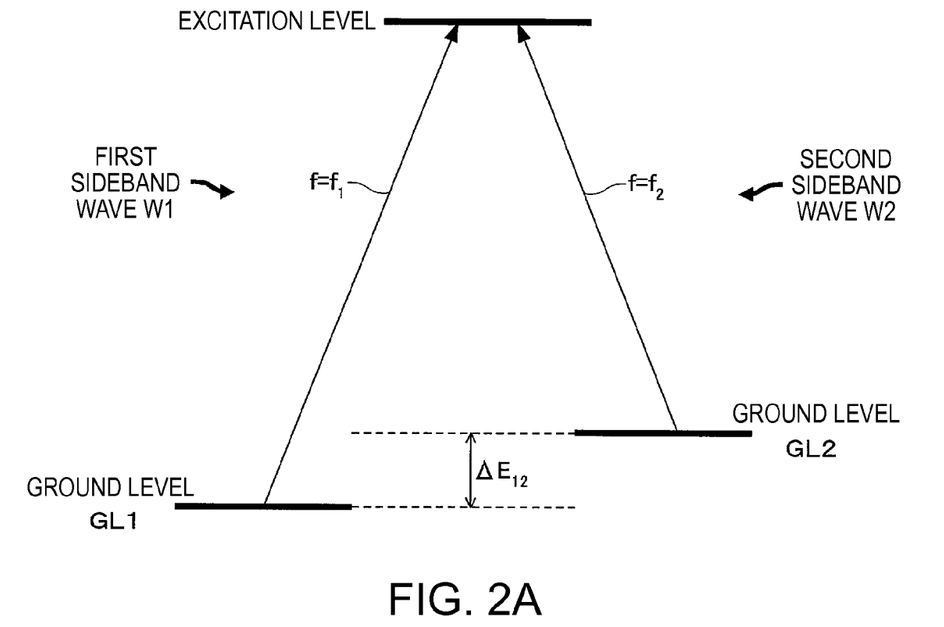
FIG. 2A is a diagram showing a relationship between a Λ-type three-level model of an alkali metal atom, and a first sideband wave and a second sideband wave.
Figure 2B:
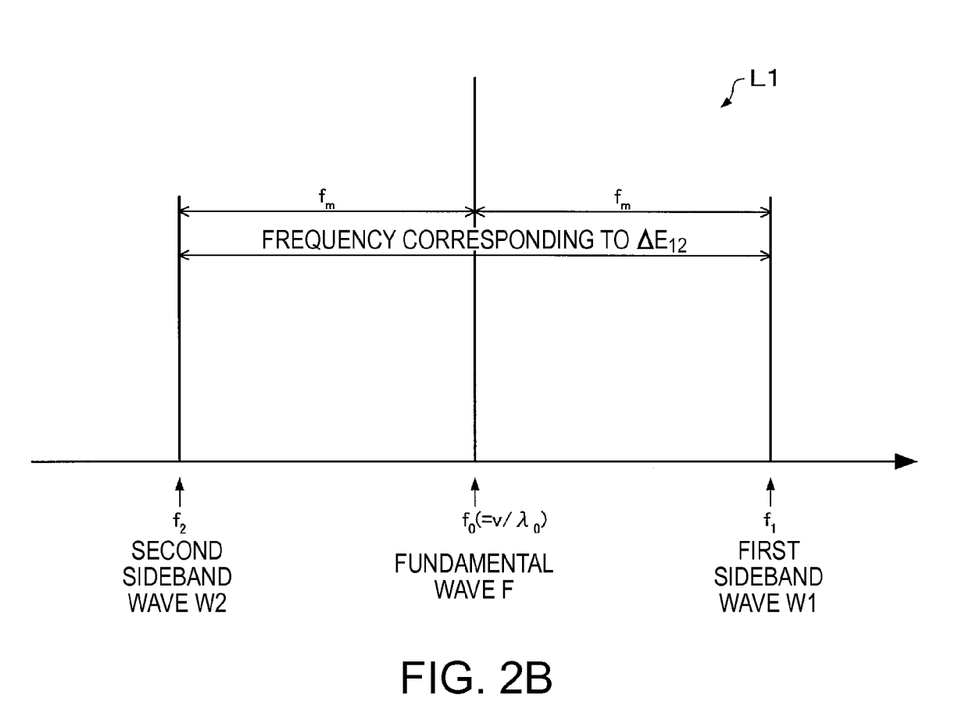
FIG. 2B is a diagram showing a frequency spectrum of a first light generated by the light source.

FIG. 2A is a diagram showing a relationship between a Λ-type three-level model of the alkali metal atoms, and the first sideband wave W1 and the second sideband wave W2. FIG. 2B is a diagram showing a frequency spectrum of the first light L1 generated by the light source 10.

As shown in FIG. 2B, the first light L1 generated in the light source 10 includes the fundamental wave F having the center frequency $f_0$ (=$\upsilon/\lambda_0$: $\upsilon$ denotes the speed of light; and $\lambda_0$ denotes the center wavelength of the laser beam), the first sideband wave W1 having the frequency $f_1$ in the upper sideband with respect to the center frequency $f_0$, and the second sideband wave W2 having the frequency $f_2$ in the lower sideband with respect to the center frequency $f_0$. The frequency $f_1$ of the first sideband wave W1 is obtained as $f_1 = f_0 + f_m$, and the frequency $f_2$ of the second sideband wave W2 is obtained as $f_2 = f_0 - f_m$.

As shown in FIGS. 2A and 2B, the frequency difference between the frequency $f_1$ of the first sideband wave W1 and the frequency $f_2$ of the second sideband wave W2 coincides with the frequency corresponding to the energy difference $\Delta E_{12}$ between the ground level GL1 and the ground level GL2 of the alkali metal atom. Therefore, the alkali metal atoms cause the EIT phenomenon with the first sideband wave W1 having the frequency $f_1$ and the second sideband wave W2 having the frequency $f_2$.

Here, the EIT phenomenon will be explained. There is known that the interaction between an alkali metal atom and the light can be explained with the Λ-type three-level model. As shown in FIG. 2A, an alkali metal atom has two ground levels, and if the alkali metal atom is irradiated with either one of the first sideband wave W1 having the wavelength (frequency $f_1$) corresponding to the energy difference between the ground level GL1 and the excitation level and the second sideband wave W2 having the wavelength (frequency $f_2$) corresponding to the energy difference between the ground level GL2 and the excitation level alone, light absorption occurs. However, as shown in FIG. 2B, if an alkali metal atom is irradiated with the first sideband wave W1 and the second sideband wave W2 having the respective frequencies $f_1$, $f_2$ the difference of which ($f_1 - f_2$) accurately coincides with the frequency corresponding to the energy difference $\Delta E_{12}$ between the ground level GL1 and the ground level GL2 simultaneously, a superposition state of the two ground levels, namely the quantum interference state, occurs to thereby cause a transparency phenomenon (the EIT phenomenon) in which the excitation to the excitation level stops, and the first sideband wave W1 and the second sideband wave W2 are transmitted through the alkali metal atom. By detecting and then controlling the steep variation in the light absorption behavior occurring when the frequency difference $f_1 - f_2$ between the first sideband wave W1 and the second sideband wave W2 is shifted from the frequency corresponding to the energy difference $\Delta E_{12}$ between the ground level GL1 and the ground level GL2 using the EIT phenomenon, a highly accurate oscillator can be manufactured.

However, if the gas cell 30 is directly irradiated with the first light L1 shown in FIG. 2B, the gas cell, namely the alkali metal atoms, is irradiated with the fundamental wave F simultaneously with the first sideband wave W1 and the second sideband wave W2. If the alkali metal atoms are irradiated with the fundamental wave F making no contribution to the EIT phenomenon, the wavelength (frequency) of the light absorbed by each the alkali metal atom varies due to the AC Stark effect. Thus, the amount of the first sideband wave W1 and the second sideband wave W2 transmitted through the alkali metal atoms varies. In the oscillator using the EIT phenomenon, the amount of the first sideband wave W1 and the second sideband wave W2 transmitted through the alkali metal atoms is detected to thereby stabilize the modulation frequency $f_m$, and the modulation frequency $f_m$ is used as the output of the oscillator to thereby enhance the frequency stability of the oscillator. Therefore, the AC Stark effect caused by the fundamental wave F degrades the detection accuracy of the first sideband wave W1 and the second sideband wave W2 to thereby degrade the stability of the modulation frequency $f_m$. Therefore, it degrades the frequency stability of the oscillator.

Figure 3:
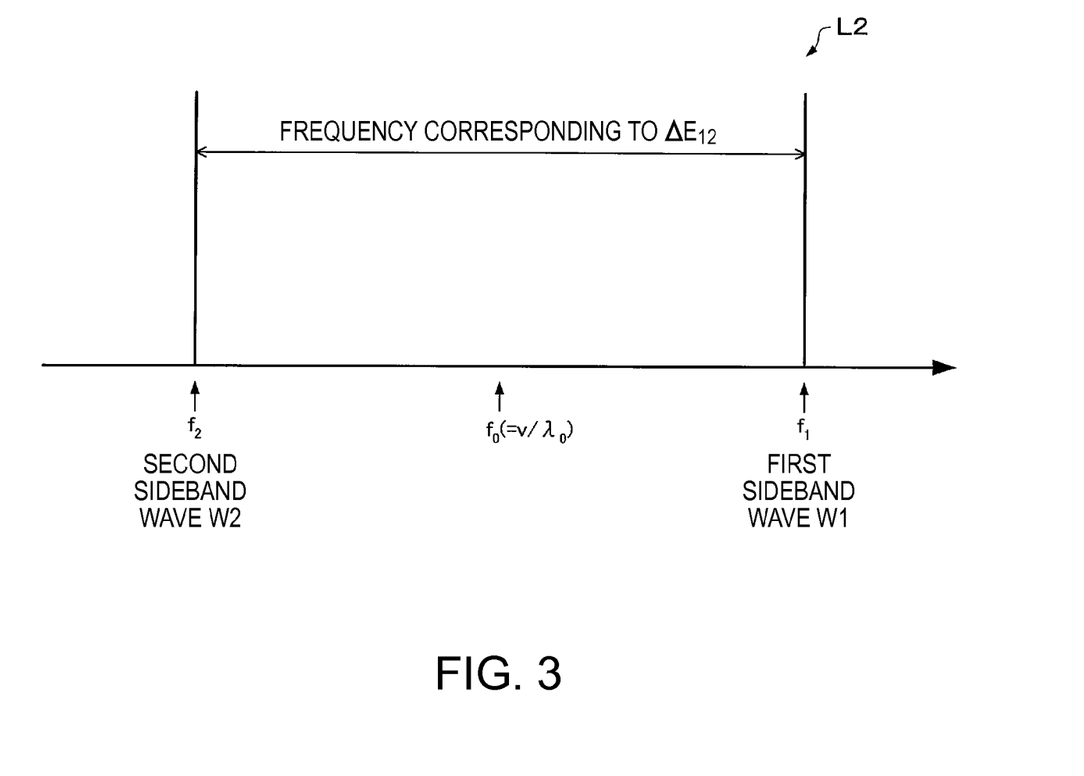
FIG. 3 is a diagram showing a frequency spectrum of a second light emitted from a wavelength selection section.

FIG. 3 is a diagram showing a frequency spectrum of the second light L2 emitted from the wavelength selection section 20.

The second light L2 is light with the fundamental wave F eliminated or decreased in intensity compared to the first light L1. In the example shown in FIG. 3, the second light L2 only has the first sideband wave W1 having the frequency $f_1$ in the upper sideband with respect to the center frequency $f_0$, and the second sideband wave W2 having the frequency $f_2$ in the lower sideband with respect to the center frequency $f_0$. As described above, in the optical module 2, it is possible to decrease the intensity of the fundamental wave F or to eliminate the fundamental wave F using the wavelength selection section 20.

Hereinafter, a more specific configuration of the atomic oscillator according to the present embodiment will be explained.

Figure 4:
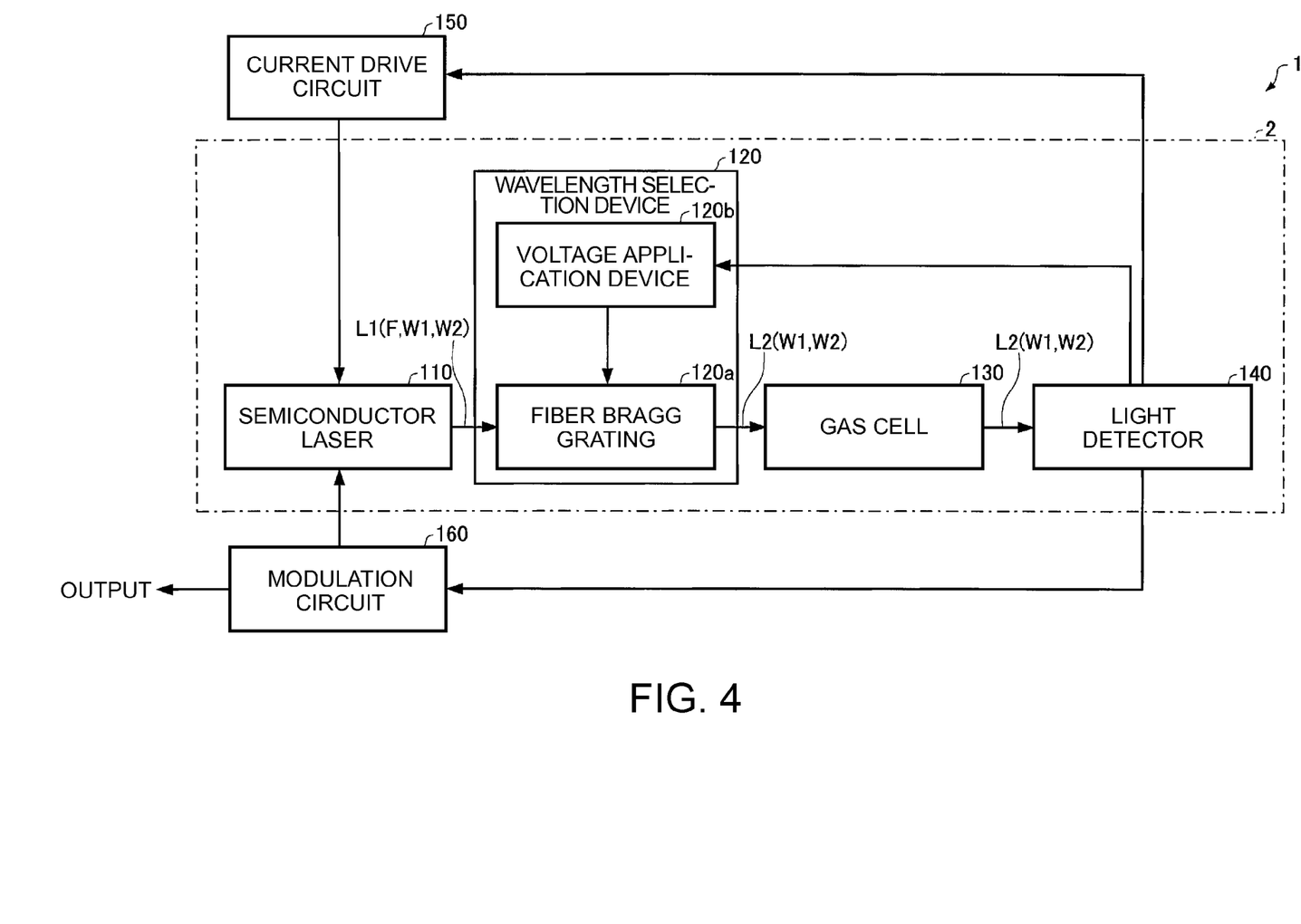
FIG. 4 is a block diagram showing a configuration of the atomic oscillator according to the present embodiment.

FIG. 4 is a block diagram showing a configuration of the atomic oscillator 1.

As shown in FIG. 4, the atomic oscillator 1 includes the optical module 2, a current drive circuit 150, and a modulation circuit 160.

The optical module 2 includes a semiconductor laser 110, a wavelength selection device 120, the gas cell 130, and a light detector 140.

The semiconductor laser 110 generates the first light L1 including the fundamental wave F having the predetermined center wavelength, and first and second sideband waves W1, W2 having respective wavelengths different from each other. The laser beam (the first light L1) emitted from the semiconductor laser 110 is controlled in the center frequency $f_0$ (the center wavelength $\lambda_0$) by the drive current output by the current drive circuit 150, and is then modulated by the output signal (the modulation signal) of the modulation circuit 160. In other words, by superimposing an alternating current having a frequency component of the modulation signal with the drive current by the current drive circuit 150, the first light L1 emitted by the semiconductor laser 110 can be modulated. Thus, the first sideband wave W1 and the second sideband wave W2 are generated in the first light L1. The light generated in the semiconductor laser 110 has a coherent property, and is therefore suitable for obtaining the quantum interference effect.

As shown in FIG. 2B, the first light L1 includes the fundamental wave F having the center frequency $f_0$ ($=v/\lambda_0$: $v$ denotes the speed of light; and $\lambda_0$ denotes the center wavelength of the first light L1), the first sideband wave W1 having the frequency $f_1$ in the upper sideband with respect to the center frequency $f_0$, and the second sideband wave W2 having the frequency $f_2$ in the lower sideband with respect to the center frequency $f_0$. The frequency $f_1$ of the first sideband wave W1 is obtained as $f_1=f_0+f_m$, and the frequency $f_2$ of the second sideband wave W2 is obtained as $f_2=f_0-f_m$.

The wavelength selection device 120 selects the first and second sideband waves W1, W2 from the first light L1, and then emits it as the second light L2. The wavelength selection device 120 has the FBG 120a for selectively emitting light in a predetermined wavelength range, and a voltage application device 120b for applying a voltage to the FBG 120a.

The FBG 120a is capable of selectively emitting the first sideband wave W1 and the second sideband wave W2 from the first light L1. Thus, it is possible to decrease the intensity of the fundamental wave F of the first light L1 having entered the FBG 120a or to eliminate the fundamental wave F thereof, and then emit it as the second light L2. In other words, in the second light L2, the intensity of the fundamental wave F is decreased or the fundamental wave F is eliminated compared to the first light L1. In the example shown in FIG. 3, the second light L2 only has the first sideband wave W1 and the second sideband wave W2.

The voltage application device 120b is capable of varying the wavelength range (the wavelength selection characteristics) of the light to be selected by the FBG 120a using the electro-optic effect. Here, the electro-optic effect denotes the phenomenon that the refractive index of a material with respect to the light is varied by externally applying the static electric field. Specifically, the voltage application device 120b applies the voltage to the FBG 120a to thereby vary the refractive index of the FBG 120a, and thus control the wavelength selection characteristics of the FBG 120a. The wavelength selection device 120 is capable of correcting the shift of the wavelength selection characteristics of the FBG 120a due to the manufacturing error, the environmental variation (e.g., the heat and the light), and so on using the voltage application device 120b, and is therefore capable of accurately selecting the first sideband wave W1 and the second sideband wave W2 from the first light L1, and then emitting them.

It is also possible for the voltage application device 120b to adjust the level of the voltage to be applied to the FBG 120a based on the output signal of the light detector 140 to thereby control the wavelength selection characteristics of the FBG 120a. In the optical module 2, the level of the voltage to be applied to the FBG 120a is adjusted by a feedback loop passing through, for example, the FBG 120a, the gas cell 130, the light detector 140, and the voltage application device 120b, and thus the wavelength selection characteristics of the FBG 120a is controlled.

Further, it is also possible for the voltage application device 120b to adjust the level of the voltage to be applied to the FBG 120a based on the data of the shift of the wavelength selection characteristics of the FBG 120a obtained in advance, and then correct the shift of the wavelength selection characteristics of the FBG 120a.

The gas cell 130 includes gaseous alkali metal atoms (e.g., sodium (Na) atoms, rubidium (Rb) atoms, and cesium (Cs)

atoms) encapsulated in a container. The gas cell 130 is irradiated with the second light L2 emitted from the wavelength selection device 120.

When the gas cell 130 is irradiated with the two light waves (the first sideband wave W1 and the second sideband wave W2) having different frequency (wavelength) corresponding to the energy difference between the two ground levels of the alkali metal atoms, the alkali metal atoms cause the EIT phenomenon. If, for example, the alkali metal atoms are cesium atoms, the frequency corresponding to the energy difference between the ground level GL1 at the D1 line and the ground level GL2 is 9.19263 . . . GHz, and therefore, the EIT phenomenon occurs in response to the irradiation with the two light waves having the frequency difference of 9.19263 . . . GHz.

The light detector 140 detects the second light L2 having been transmitted through the gas cell 130, and then outputs a signal having a signal level corresponding to the amount of the light detected. The output signal of the light detector 140 is input to the current drive circuit 150 and the modulation circuit 160. Further, it is also possible for the output signal of the light detector 140 to be input to the voltage application device 120b. The light detector 140 is, for example, a photo diode.

The current drive circuit 150 generates the drive current having a level corresponding to the output signal of the light detector 140, and then supplies the semiconductor laser 110 with the drive current to thereby control the center frequency $f_0$ (the center wavelength $\lambda_0$) of the first light L1. The center frequency $f_0$ (the center wavelength $\lambda_0$) of the first light L1 is finely adjusted and stabilized by the feedback loop passing through the semiconductor laser 110, the wavelength selection device 120, the gas cell 130, the light detector 140, and the current drive circuit 150.

The modulation circuit 160 generates a modulation signal having the modulation frequency $f_m$ corresponding to the output signal of the light detector 140. The modulation signal is supplied to the semiconductor laser 110 while the modulation frequency $f_m$ thereof is finely adjusted so that the output signal of the light detector 140 becomes enlarged. The laser beam emitted by the semiconductor laser 110 is modulated in accordance with the modulation signal to thereby generate the first sideband wave W1 and the second sideband wave W2.

It should be noted that the semiconductor laser 110, the wavelength selection device 120, the gas cell 130, and the light detector 140 correspond respectively to the light source 10, the wavelength selection section 20, the gas cell 30, and the light detection section 40 shown in FIG. 1. Further, the FBG 120a corresponds to the FBG 20a shown in FIG. 1, and the voltage application device 120b corresponds to the voltage application section 20b shown in FIG. 1. Still further, the current drive circuit 150 and the modulation circuit 160 correspond to the control section 50 shown in FIG. 1.

In the atomic oscillator 1 having such a configuration, since the alkali metal atoms fails to cause the EIT phenomenon unless the frequency difference between the first sideband wave W1 and the second sideband wave W2 of the first light L1 generated by the semiconductor laser 110 accurately coincides with the frequency corresponding to the energy difference between the two ground levels of the alkali metal atoms included in the gas cell 130, the detection amount of the light detector 140 varies (increases) in an extremely susceptible manner in accordance with the frequencies of the first sideband wave W1 and the second sideband wave W2. Therefore, feedback control is performed by the feedback loop passing through the semiconductor laser 110, the wavelength selection device 120, the gas cell 130, the light detector 140, and the modulation circuit 160 so that the frequency difference between the first sideband wave W1 and the second sideband wave W2 coincides with the frequency corresponding to the energy difference between the two ground levels of the alkali metal atoms with great accuracy. As a result, since the modulation frequency becomes an extremely stable frequency, the modulation signal can be used as the output signal (clock output) of the atomic oscillator 1.

Figure 5:
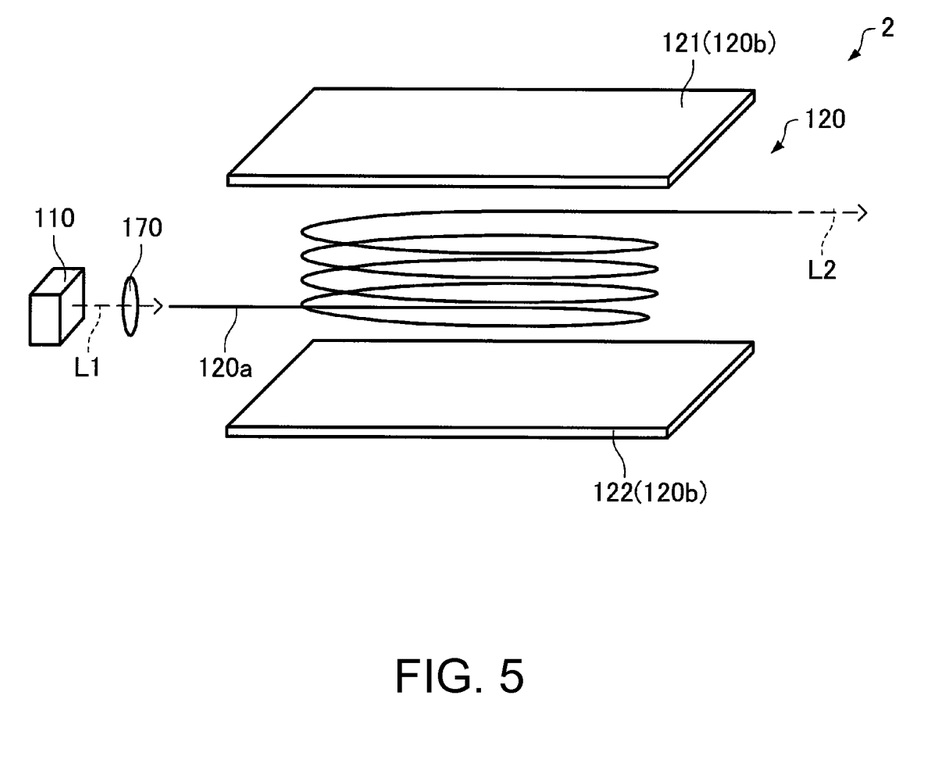
FIG. 5 is a perspective view schematically showing a substantial part of an optical module according to the present embodiment.

FIG. 5 is a perspective view schematically showing part (the semiconductor laser 110 and the wavelength selection device 120) of the optical module 2.

As the semiconductor laser 110, a surface emitting laser, for example, can be used. Since the surface emitting laser requires a small current for generating the gain compared to the edge emitting laser, reduction in power consumption can be achieved. It should be noted that it is also possible to use the edge emitting laser as the semiconductor laser 110. As shown in FIG. 5, the first light L1 emitted from the semiconductor laser 110 is collected by an optical element 170, and then enters the FBG 120a. In the example shown in the drawing, the optical element 170 is a lens for collecting the light L1 emitted from the semiconductor laser 110 to thereby make it enter the FBG 120a.

The FBG 120a is formed by providing a periodical variation in the refractive index to the core of an optical fiber. Therefore, the periodical refractive index modulation can be obtained in the longitudinal direction of the optical fiber, and the light signal (the fundamental wave F) within the wavelength range coincident with the period is reflected while the light signals (the first sideband wave W1 and the second sideband wave W2) in another wavelength range are transmitted therethrough without sensing the periodical refractive index variation. In other words, in the FBG 120a, the reflectance with respect to the first sideband wave W1 and the second sideband wave W2 is low, and the reflectance with respect to the fundamental wave F is high. Therefore, the FBG 120a is capable of reflecting the fundamental wave F and transmitting the first sideband wave W1 and the second sideband wave W2. Since the optical fiber is used as the FBG 120a, the FBG 120a can easily be deformed, and the design freedom can be enhanced. The FBG 120a can be wound around a bobbin (not shown), for example.

As shown in FIG. 5, the FBG 120a is disposed between a first electrode 121 and a second electrode 122 of the voltage application device 120b. The FBG 120a is capable of selectively transmitting the first sideband wave W1 and the second sideband wave W2 from the first light L1 having entered.

The voltage application device 120b has the first electrode 121 and the second electrode 122 for applying the voltage to the FBG 120a. When the voltage application device 120b applies the voltage to the FBG 120a located between the first and second electrodes 121, 122, the electro-optic effect occurs to thereby vary the refractive index of the FBG 120a, and thus the wavelength selection characteristics (the wavelength range of the light to be selected by the FBG) of the FBG 120a are varied.

The optical module 2 and the atomic oscillator 1 have the following features, for example.

According to the optical module 2, it is possible for the wavelength selection section 120 to decrease the intensity of the fundamental wave F or to eliminate the fundamental wave F. Thus, it is possible to control or prevent the alkali metal atom from being irradiated with the fundamental wave F making no contribution to the FIT phenomenon. Therefore, it is possible to reduce the frequency variation due to the AC Stark effect to thereby provide an oscillator with high frequency stability.

According to the optical module 2, since the wavelength selection device 120 has the voltage application device 120b for varying the wavelength range of the light to be selected by the FBG 120a, the shift of the wavelength selection characteristics (the wavelength range of the light to be selected by the FBG) of the FBG 120a due to manufacturing error or environmental variation (e.g., the heat and the light) can be corrected. Therefore, the wavelength selection device 120 is capable of accurately selecting the first sideband wave W1 and the second sideband wave W2 from the first light L1, and then emitting them.

The wavelength selection characteristics of the FBG 120a depend on the periodical variation in the refractive index provided to the core of the optical fiber. It is difficult to provide periodical variation in the refractive index to the core of the optical fiber with accuracy in the manufacturing process of the FBG 120a, and therefore, there is a case in which the manufacturing error is caused in the FBG 120a. Since the wavelength selection device 120 has the voltage application device 120b, even in such a case, the wavelength selection device 120 can correct the shift in the wavelength selection characteristics due to the manufacturing error.

In the optical module 2, the voltage application device 120b is capable to varying the wavelength selection characteristics of the FBG 120a using the electro-optic effect. Thus, the wavelength selection characteristics of the FBG can easily be controlled with accuracy. Further, the voltage application device 120b is configured including the first electrode 121 and the second electrode 122 for applying the voltage to the FBG 120a. Therefore, the wavelength selection device 120 can be made to have a simple configuration.

In the optical module 2, the semiconductor laser 110 can be a surface emitting laser. Since the surface emitting laser requires a small current for generating the gain compared to the edge emitting laser, reduction in power consumption can be achieved.

In the optical module 2, there is provided the optical element 170 for making the light L1 emitted from the semiconductor laser 110 enter the FBG 120a. Thus, the light L1 generated in the semiconductor laser 110 can efficiently be guided to the FBG 120a.

In the atomic oscillator 1, there is provided the optical module 2. Therefore, as described above, the frequency stability can be enhanced.

As described above, although the embodiments of the invention are hereinabove explained in detail, it should be understood by those skilled in the art that various modifications not substantially departing from the novel matters and the advantages of the invention are possible. Therefore, such modified examples are included in the scope of the invention.

The entire disclosure of Japanese Patent Application No. 2011-055433, filed Mar. 14, 2011 is expressly incorporated by reference herein.

What is claimed is:

1. An optical module for an atomic oscillator using a quantum interference effect, comprising:
    a light source adapted to emit light including a fundamental wave having a predetermined wavelength, and sideband waves of the fundamental wave;
    a wavelength selection section receiving the light from the light source, and adapted to transmit the sideband waves and reduce the fundamental wave out of the light input;
    a gas cell encapsulating an alkali metal gas, and irradiated with light transmitted through the wavelength selection section; and
    a light detection section adapted to detect an intensity of light transmitted through the gas cell,
    wherein the wavelength selection section includes:
        a fiber Bragg grating, and
        a voltage application section adapted to apply a voltage to the fiber Bragg grating.

2. The optical module for an atomic oscillator according to claim 1, wherein,
    the voltage application section has a first electrode and a second electrode, and
    the fiber Bragg grating is disposed between the first electrode and the second electrode.

3. The optical module for an atomic oscillator according to claim 1, wherein,
    the light source is a surface emitting laser.

4. The optical module for an atomic oscillator according to claim 1, further comprising:
    an optical element adapted to make the light emitted from the light source enter the fiber Bragg grating.

5. An atomic oscillator comprising:
    the optical module for an atomic oscillator according to claim 1.

6. An atomic oscillator comprising:
    the optical module for an atomic oscillator according to claim 2.

7. An atomic oscillator comprising:
    the optical module for an atomic oscillator according to claim 3.

8. An atomic oscillator comprising:
    the optical module for an atomic oscillator according to claim 4.

9. An atomic oscillator using a quantum interference effect, comprising:
    a light source adapted to emit light including a fundamental wave having a predetermined wavelength, and sideband waves of the fundamental wave;
    a wavelength selection section receiving the light from the light source, and adapted to transmit the sideband waves and reduce the fundamental wave out of the light input;
    a gas cell encapsulating an alkali metal gas, and irradiated with light transmitted through the wavelength selection section; and
    a light detection section adapted to detect an intensity of light transmitted through the gas cell,
    wherein the wavelength selection section includes:
        a fiber Bragg grating, and
        a voltage application section adapted to apply a voltage to the fiber Bragg grating.

* * * * *